(12) United States Patent
DiBiase

(10) Patent No.: US 7,408,642 B1
(45) Date of Patent: Aug. 5, 2008

(54) REGISTRATION TARGET DESIGN FOR MANAGING BOTH RETICLE GRID ERROR AND WAFER OVERLAY

(75) Inventor: Tony DiBiase, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 346 days.

(21) Appl. No.: 11/356,878

(22) Filed: Feb. 17, 2006

(51) Int. Cl.
*G01B 11/00* (2006.01)
(52) U.S. Cl. .................................... 356/401; 356/399
(58) Field of Classification Search .................. 356/399, 356/401
See application file for complete search history.

(56) References Cited

U.S. PATENT DOCUMENTS

| | | | | |
|---|---|---|---|---|
| 6,023,338 A | 2/2000 | Bareket | ...................... | 356/401 |
| 6,118,185 A | 9/2000 | Chen et al. | ................... | 257/797 |
| 6,128,089 A * | 10/2000 | Ausschnitt et al. | .......... | 356/401 |
| 6,130,750 A | 10/2000 | Ausschnitt et al. | .......... | 356/401 |
| 6,462,818 B1 | 10/2002 | Bareket | ...................... | 356/401 |
| 6,486,954 B1 | 11/2002 | Mieher | ....................... | 356/401 |
| 6,921,916 B2 | 7/2005 | Adel et al. | ..................... | 257/48 |
| 6,985,618 B2 | 1/2006 | Adel et al. | .................. | 382/151 |
| 2002/0155356 A1* | 10/2002 | Fujimoto | ....................... | 430/5 |
| 2003/0189705 A1* | 10/2003 | Pardo | .......................... | 356/401 |
| 2005/0094145 A1* | 5/2005 | Lin | ............................. | 356/401 |

* cited by examiner

*Primary Examiner*—Roy M Punnoose
(74) *Attorney, Agent, or Firm*—Joshua D. Isenberg; JDI Patent

(57) ABSTRACT

A combined overlay target and methods for its use are disclosed. The combined overlay target includes a grating-type overlay target and an image placement error target having substantially perpendicular features with spaced apart edges. The grating-type target and the image placement error target have a common centroid and are sufficiently separated that the grating-type overlay target does not interfere with measurement of image placement error.

37 Claims, 8 Drawing Sheets

REGISTRATION TARGET DESIGN FOR MANAGING BOTH RETICLE GRID ERROR AND WAFER OVERLAY

BACKGROUND OF THE INVENTION

1. Field of the Invention

The present invention relates generally to the testing of semiconductor wafers during the production of the wafer. More specifically, the present invention relates to the use of a new alignment pattern to determine the registration accuracy between two patterned layers on a semiconductor wafer and image placement accuracy of each patterned layer.

2. Background

One of the most critical process control techniques used in the manufacturing of integrated circuits is the measurement of overlay accuracy between successive, patterned layers on a wafer (i.e., the determination of how accurately a patterned layer aligns with respect to the layer above or below it).

Presently this measurement is done with test patterns that are etched into the layers. The relative displacement is measured by imaging the patterns at high magnification on an electronic camera using any of a variety of known image analysis algorithms. The most commonly used patterns are concentric squares with dimensions of approximately 20 to 40 micrometers on each side, generally referred to as "box within a box" target. FIG. 1 illustrates a typical "box" type target 5. Such targets may be built into scribe lines between adjacent dies on a wafer. An inner box 1 is typically printed on a top layer of the semiconductor wafer being produced, while an open-center-outer box 2 is printed on the second layer down on the semiconductor wafer. The measurement process thus involves imaging target 5 on an electronic camera, by means of a microscope system, at a high magnification (e.g., 1000×, typically) and with high resolution in both x and y directions.

As is generally well known, the overlay error between the two boxes, along the x-axis for example, is determined by calculating the locations of the edges of lines c1 and c2 of the outer box 2, and the edge locations of the lines C3 and C4 of the inner box 1, and then comparing the average separation between lines C1 and C3 with the average separation between lines C2 and C4. Half of the difference between the average separations C1 and C3 and C2 and C4 is the overlay error (along the x-axis). Thus, if the average spacing between lines C1 and C3 is the same as the average spacing between lines C2 and C4, the corresponding overlay error tends to be zero. Although not described, the overlay error between the two boxes along the y-axis may also be determined using the above technique.

This prior art is further described and analyzed by Neal T. Sullivan, "Semiconductor Pattern Overlay", in Handbook of Critical Dimensions Metrology and Process Control, pp. 160-188, vol. CR52, SPIE Press (1993). The accuracy of this technique is limited by the asymmetry of etched line profiles, by aberrations in the illumination and imaging optics, and by image sampling in the camera. In addition, chemical mechanical planarization (CMP), which is often used in semiconductor manufacturing, can damage such alignment structures. Variations on such box-in-box structures are also described in U.S. Pat. Nos. 6,118,185 and 6,130,750, the disclosures of both of which are incorporated herein by reference.

Partly in response to the above concerns, a grating-type mark was developed. An example of such a mark 10 is shown in FIG. 2. The mark 10 includes a first periodic structure 12 and a second periodic test structure 14. The first periodic test structure 12 is placed on a first layer of a device and the second periodic structure 14 is placed on a second layer of the device adjacent the first periodic structure 12 when the second layer is placed on the first layer. Any offset that may occur between the first and second periodic structures 12, 14 may be detected optically, micro-mechanically or with electron beams. Such grating style targets (sometimes referred to as "AIM" marks) can be denser and more robust, than "box" or ring-type marks resulting in the collection of more process information, as well as target structures that can withstand the rigors of CMP. The use of such marks is described, e.g., by Adel et al in commonly assigned U.S. Pat. Nos. 6,023,338, 6,921,916 and 6,985,618, all three of which are incorporated herein by reference for all purposes.

Unfortunately, as the semiconductor industry uses smaller and smaller design rules, the total error budget for overlay becomes smaller. Part of this error budget includes measurement of both overlay error and a type of error known as image placement error. This latter error is related to the absolute displacement of features of the pattern formed in a layer during a semiconductor fabrication process, usually at the photomask or other tooling used to print the pattern at the wafer level. Unfortunately, grating-type (AIM) marks are not suitable for measurement of this error. Absolute displacement or image placement error measurements require isolated "X" and "Y" edges, which conflict with the dense grating-type marks.

Thus, there is a need in the art, for a new type of alignment mark that overcomes the above disadvantages and a method for using such a mark.

SUMMARY OF THE INVENTION

Embodiments of the present invention use a combined mark as a target for use in measuring the relative position between two substantially coplanar layers of a device wherein a second layer of said two layers is located on a first layer of said two layers.

In embodiments of the present invention, a combined overlay and image placement error target may include image placement error targets and grating-type overlay targets. A first image placement error structure may be placed on a first layer of a device such that the first image placement error structure is visible through a second layer. A first periodic structure may be placed on the first layer of said device proximate said first image placement error structure such that the first periodic structure is visible through said second layer. The first image placement error structure and first periodic structure may have a common centroid. The first periodic structure may be sufficiently spaced-apart from the first image placement error structure that the first periodic structure does not interfere with image placement error measurements made using said first image placement error structure. A second periodic structure that complements the first periodic structure may be placed on the second layer of the device at a location that is adjacent the first periodic structure when the second layer is placed on the first layer. A second image placement error structure may be placed on the second layer proximate the first and second periodic structures. The second image placement error structure and said second periodic structure may have a common centroid. The first and second periodic structures may be sufficiently spaced-apart from the second image placement error structure that the first and second periodic structures do not interfere with an image placement error measurement made using the second image placement error structure.

In some embodiments, the combined overlay target may include a grating-type mark located within a ring-type mark. The grating-type mark and the ring type mark may have a common centroid. The target may include a first ring structure to be placed on said first layer of the device. The fist ring structure is visible through the second layer. A first periodic structure may be placed on the first layer of the device within said first ring structure such that the first periodic structure is visible through the second layer. A second periodic structure that complements the first periodic structure may be placed on the second layer of the device within the first ring structure at a location that is adjacent the first periodic structure when said second layer is placed on said first layer. A second ring structure that complements said first ring structure may be placed on the second layer within said first ring structure such that the first and second periodic structures are located within said second ring structure.

BRIEF DESCRIPTION OF THE DRAWINGS

Other objects and advantages of the invention will become apparent upon reading the following detailed description and upon reference to the accompanying drawings in which:

FIG. 6C illustrates a pair of collapsed ID signals, as used in making an overlay measurement with a combined overlay mark in accordance with one embodiment of the present invention.

DESCRIPTION OF THE SPECIFIC EMBODIMENTS

Although the following detailed description contains many specific details for the purposes of illustration, anyone with ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
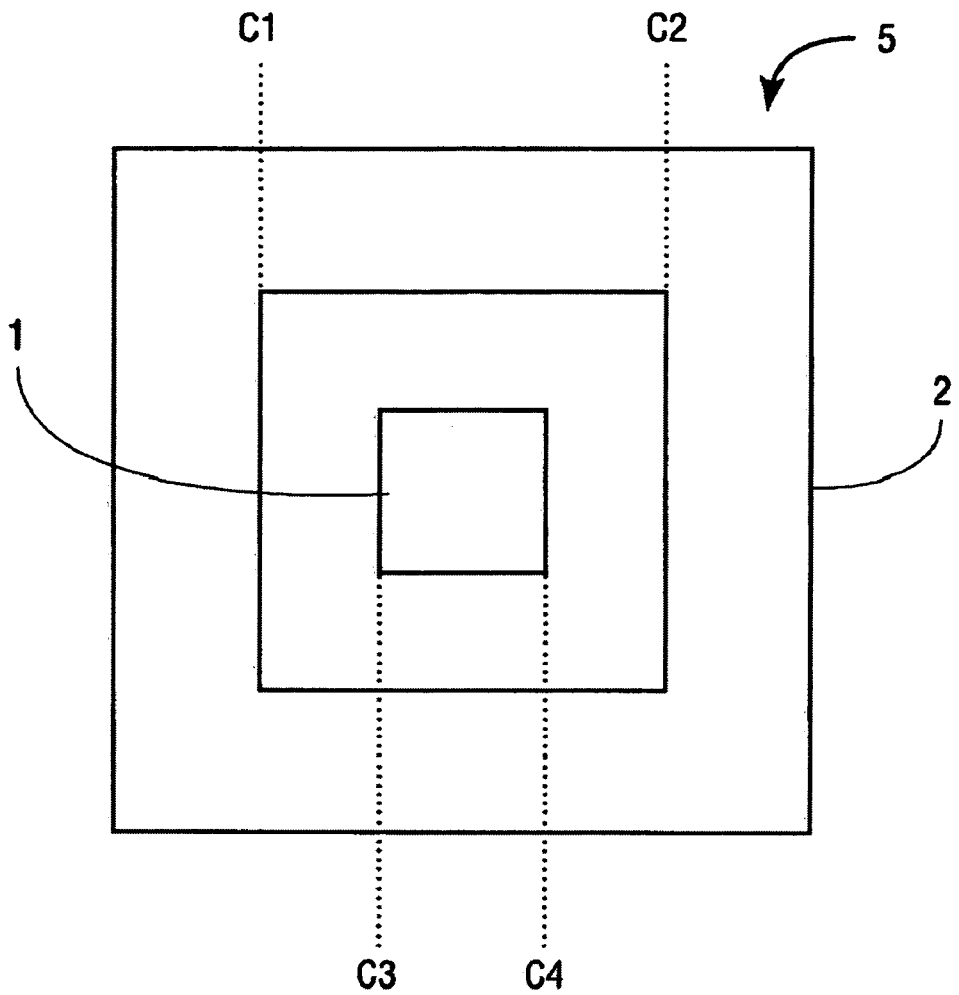
FIG. 1 is a top plan view of a prior art "box-inbox" overlay mark.
Figure 2:
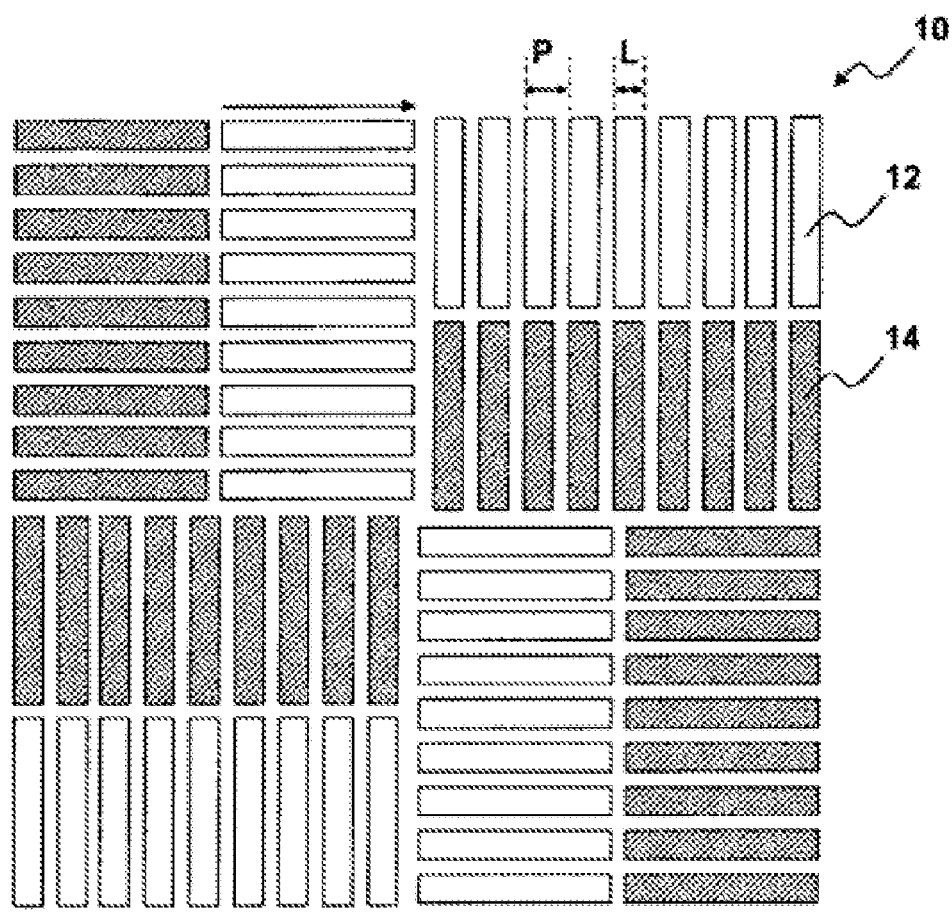
FIG. 2 is a top plan view of a prior art grating-type overlay mark.
Figure 3:
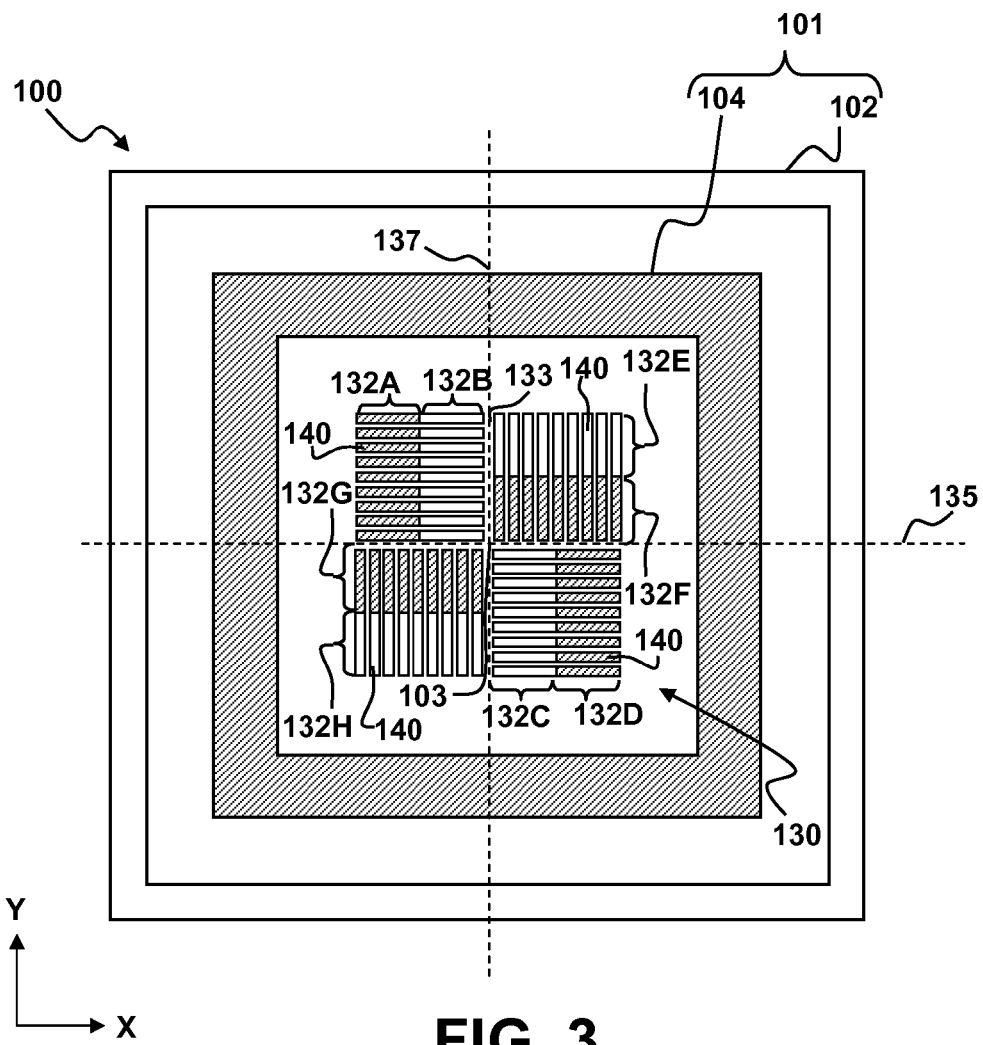
FIG. 3 is a top plan view of a combined overlay and image placement mark according to an embodiment of the present invention.

FIG. 3 is a top plan view of combined overlay target 100, in accordance with an embodiment of the invention. For ease of discussion, the combination target 100 will be described in context of measuring overlay between different layers of a substrate. It should be noted, however, that the combined target 100 may also be used to measure two or more separately generated patterns on a single layer of a substrate. The combined overlay target 100 includes a grating-type mark 130 located within a ring-type mark 101. The grating-type mark 130 and the ring type mark 101 have a common centroid 103. The term centroid refers to a geometric center, e.g., analogous to a center of mass.

An advantage to locating the grating-type mark 130 inside the ring-type mark 101 is an improved ability to center the two marks with respect to each other if the grating-type mark 130 is inside the ring-type mark 101. In particular, because the centroid 103 of both marks is the same, measurements made on templates used to form the combined target 100 at a mask shop will naturally be at the same position. This is important because certain aberrations in forming an image of the target 100, e.g., lens aberrations, are position sensitive. An additional advantage is that if the grating-type target 130 lies within the ring-type mark 101, the combined target 100 can take up less real-estate on the masks (reticles or imprint templates) used to make the combined target 100.

In theory, it is possible use the ring-type target 101 to get all the desired overlay data. The advantage of using the small grating-type target 130 within the ring-type target 101 is that grating-type targets are very tolerant of process variation induced by CMP and other etch-related deterioration of the structures. Thus, the combined target 100 is more robust than a ring-type target and can provide information that cannot be obtained with a grating-type target while taking up no more space that a ring-type target.

The ring-type mark 101 includes a first ring structure 102 formed in a first layer and a second ring structure 104 that is centered within the first ring structure 102 may be formed in a second layer that overlies the first layer. In FIG. 3, structures in the first layer are shown without cross-hatching and structures in the second layer are cross-hatched. Each of the ring structures 102, 104 has substantially perpendicular straight segments that allow for measurement of image placement error. Preferably, each segment is thick enough to present two spaced apart substantially parallel edges that can be scanned using a conventional image placement error tool. The first ring structure 102 may be used to measure image placement errors in the first layer and the second ring structure 104 may be used to measure image placement errors in the second layer. As used herein, the term "substantially perpendicular" means that the segments are sufficiently perpendicular that they are within acceptable tolerances for image placement error measurements. Similarly, the term "substantially parallel" means that the edges are sufficiently parallel that they are within acceptable tolerances for image placement error measurements.

Although ring-type structures are desirable since that also allow for separate measurement of overlay error as described above. The ring structures 102,104 may alternatively be replaced with "L"-type marks, bar-type or cross-type marks.

The first ring structure 102 is formed on a first layer of a device and the second ring structure 104 formed in a second layer that lies on top of the first layer. The first ring structure 102 is configured such that it can be viewed through the first layer. The first ring structure 102 may be made visible through the layer on top of it in a number of different ways. The films deposited over the first ring 102 may be made of a material that is sufficiently thin and optically transparent to the wavelengths used by the overlay measurement tools. Examples of such materials include photoresists, silicon oxides, etc. Even if the film on top of the first ring structure 102 is not transparent, the topography of the first ring structure 102 may be defined sufficiently that its edges may be seen by the metrology tool.

In the example shown, the ring structures 102, 104 are rectangular boxes having straight edges. In the example shown in FIG. 3, each ring structure has edges that meet at right angles at a corner. These corners can be used to determine an absolute displacement between the two ring structures 102, 104. The grating-type mark 130 may be used to measure point for point overlay error. Because the ring mark 101 and grating-type mark 130 have a common centroid 103 overlay-inducing errors (such as lens aberrations) may be finely mapped. The ring mark 101 also allows measurement of overlay errors on older tools that cannot measure errors using the grating-type mark 130.

By way of example, grating-type mark 130 may be configured to measure point to point overlay error in two separate directions. However, embodiments of the invention are not limited to this particular configuration. In the example depicted in FIG. 3, the grating-type mark 130 is shown in a configuration that results when the tested layers of a wafer are in perfect alignment. The grating-type mark 130 is generally provided to determine the relative shift between two or more successive layers of a wafer or between two or more separately generated patterns on a single layer of a wafer.

The grating-type mark 130 includes a plurality of periodic structures 132 for determining the registration error between two wafer layers in two different directions. In the example shown in FIG. 3, the grating-type mark 130 includes eight rectangular shaped periodic structures 132. The structures 132 include four vertical structures 132A, 132B, 132C, 132D and 4 horizontal structures 132E, 132F, 132G and 132H. Each periodic structure includes a series of regularly spaced segmented lines 140 characterized by a pitch P, length L and width W, which may be widely varied. In the example shown, each periodic structure has an overall width approximately equal to 2W. The segmented lines 140 of juxtaposed periodic structures 132 may be aligned with one another, i.e., if we ignore the different layers they appear to be continuous gratings. For example, the coarsely segmented lines of periodic structure 132A may align with the coarsely segmented lines of periodic structure 132B and coarsely segmented lines of periodic structure 132C may align with the coarsely segmented lines of periodic structure 132D. In addition, the coarsely segmented lines of periodic structure 132E may align with the coarsely segmented lines of periodic structure 132F and coarsely segmented lines of periodic structure 132G may align with the coarsely segmented lines of periodic structure 132H.

The periodic structures 132 represent the actual areas of the mark that are used to calculate alignment between different layers of the wafer. The working zones 132 may be spatially separated from one another so that they do not overlap portions of an adjacent working zone. Some of the working zones may be separated via exclusion zones while other working zones are positioned next to an adjacent working zone. For example, working zone 132B is separated from working zones 132E and 132F via an exclusion zone 133 while working zones 132E and F are positioned next to one another at their edges.

To facilitate discussion, the periodic structures 132 may be grouped into two groups. A first group includes four periodic structures 132A-D that are configured to provide overlay information in a first direction. By way of example, the first direction may be the Y direction. Of the four working zones 132A-D, two of them 132A and 132D are disposed in the first layer and two of them 132B and C are disposed in the second layer (the first layer is represented by cross hatching, the second layer is represented by no cross hatching). As should be appreciated, for this mark configuration and in the case of zero overlay error (as shown), the centers of symmetry 135 of periodic structures 132A&D and periodic structures 132B&C coincide exactly. A second working group includes four periodic structures 132E-H configured to provide overlay information in a second direction that is perpendicular to the first direction. By way of example, the second direction may be the X direction. Of the four periodic structures 132E-H, two of them 132E and 132H are disposed in the first layer and two of them 132F and G are disposed in the second layer (the first layer is represented by cross hatching, the second layer is represented by no cross hatching). Similarly to the above, for this mark configuration and in the case of zero overlay (as shown), the centers of symmetry 137 of periodic structures 132E&H and periodic structures 132F&G coincide exactly. The centers of symmetry 135, 137 may intersect at the common centroid 103.

As should be appreciated, each of the groups represents an "X"-configured mark (albeit offset). For example, periodic structures 132A&D, which are on the same first layer, may be in diagonally opposed positions relative to one another, and periodic structures 132B&C, which are on the same second layer, may be in diagonally opposed positions relative to one another. Further, periodic structures 132A&D are angled relative to periodic structures 1322B&C. Further still, periodic structure 132A is spatially offset from periodic structure 132D, and periodic structure 132B is spatially offset from periodic structure 132D.

Preferably, the periodic structures 132A-132H are sufficiently spaced from the second ring-type structure 104 that the they do not interfere with image placement error measurements taken with the second ring-type structure 104. By way of example, and without limitation, a clearance of about 1 micron between periodic structures 132A-132H and an inner edge of the second ring-type structure 104 may be sufficient.

Figure 6A:
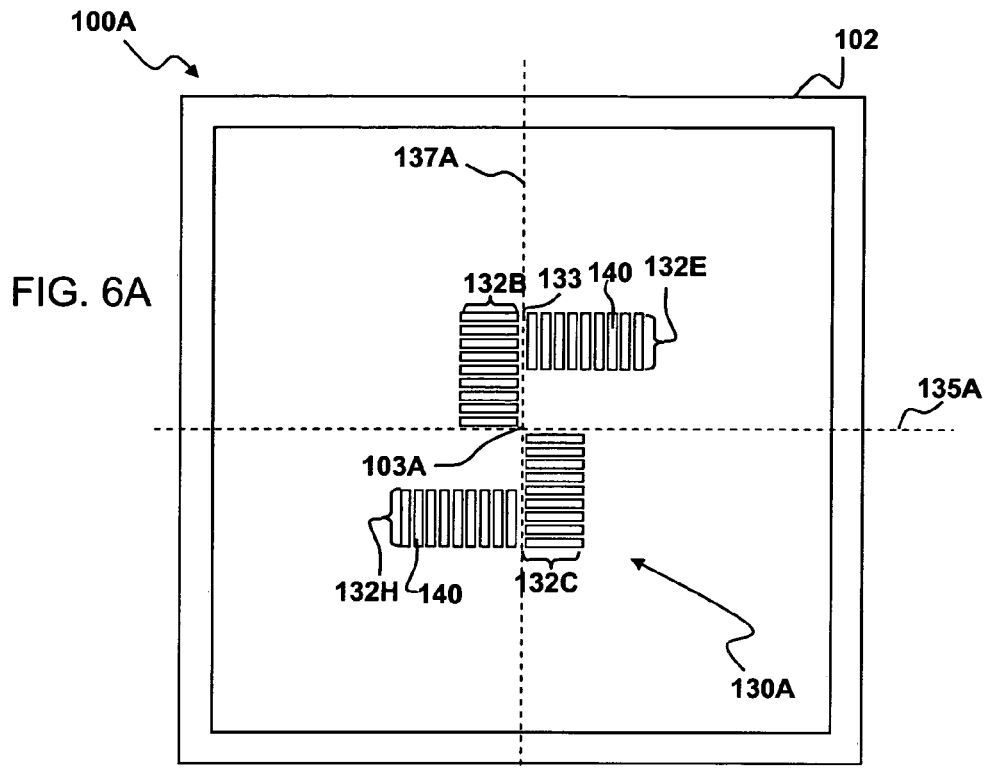
FIG. 6A is a simplified flow diagram illustrating a method of calculating overlay, using a combined overlay mark in accordance with one embodiment of the present invention.
Figure 6B:
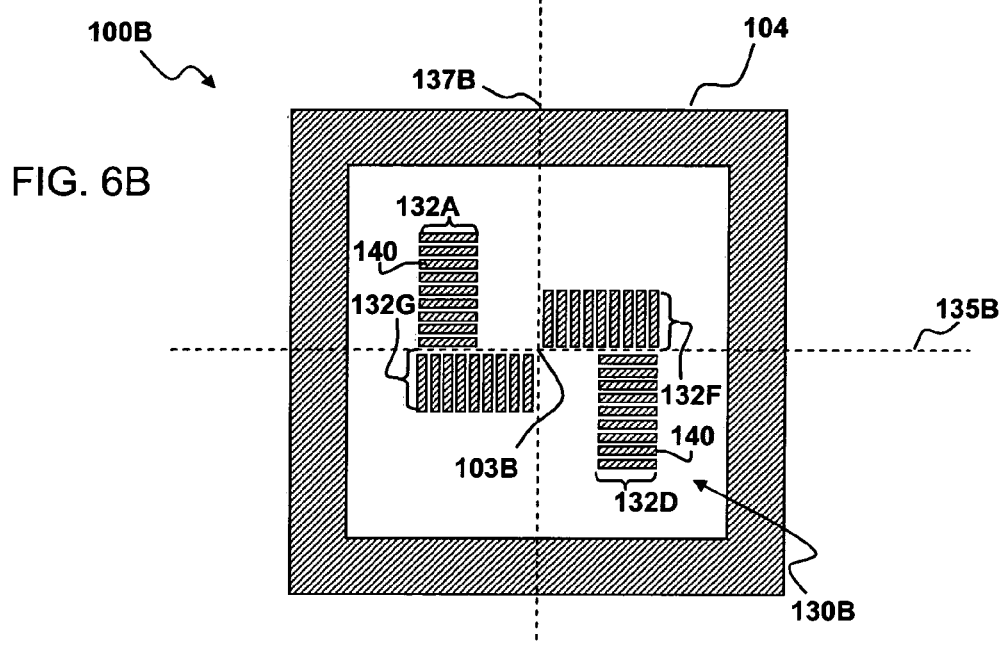
FIG. 6B is a top plan view of a portion of the overlay mark of FIG. 3, in accordance with one embodiment of the present invention.

The combined overlay target 100 of FIG. 3 may be made from two different combined targets that are formed in different layers of a device using different masks (e.g., different reticle or imprint templates). For example as shown in FIGS. 6A-6B, a first combined target 100A may be made using a first reticle or template in a first layer of a device. The first combined target 100A may include the first ring structure 102 and a first grating type mark 130A made up of periodic structures 132B, 132C, 13E and 132H. The first ring-type mark 102 and the first grating-type mark 130A have a common centroid 103A, which may be located at an intersection of axes 135A, 137A. A second target 100B that complements the first target 100A may be made in a second layer of the device using a different reticle or template. The second target 100B may include the second ring structure 104 and a second grating-type mark 130B made up of periodic structures 132A, 132D, 132F and 132G. The second ring-type mark 104 and second grating-type mark 130B have a common centroid 103B, which may be located at an intersection of axes 135B, 137B. When the first and second overlay targets 100A, 100B are aligned their centroids 103A, 103B coincide as shown in FIG. 3. It is noted that numerous variations are possible on the configurations of the periodic structures. Examples of such variations are described, e.g., in U.S. Pat. Nos. 6,023,338, 6,921,916 and 6,985,618, which have been incorporated herein by reference.

The configuration of the periodic structures 132A-132H may be rotationally symmetric (±90, 180, 270, 360 degrees around the center of the mark). This is typically done to reduce the impact of radial and axial variations across the field of view of the metrology tool, as for example, radial and axial variations caused by non-uniform optical aberrations and illumination that may cause tool induced shifts (TIS). Radial variations generally refer to variations that radiate from the center of the mark to the outer regions of the mark. Axial variations generally refer to variations that occur in directions along the axis of the mark, as for example, in the X direction from the left to the right portions of the mark, and in the Y direction from the lower to the upper portions of the mark.

Embodiments of the present invention allow for allow for measurement of both absolute grid error on a photomask or imprint template and the eventual layer to layer overlay at the wafer level. By using the same target for both types of error measurements, point for point measurements are made with the same centroid allowing issues such as lens aberrations to be accurately reflected.

Figure 4A:
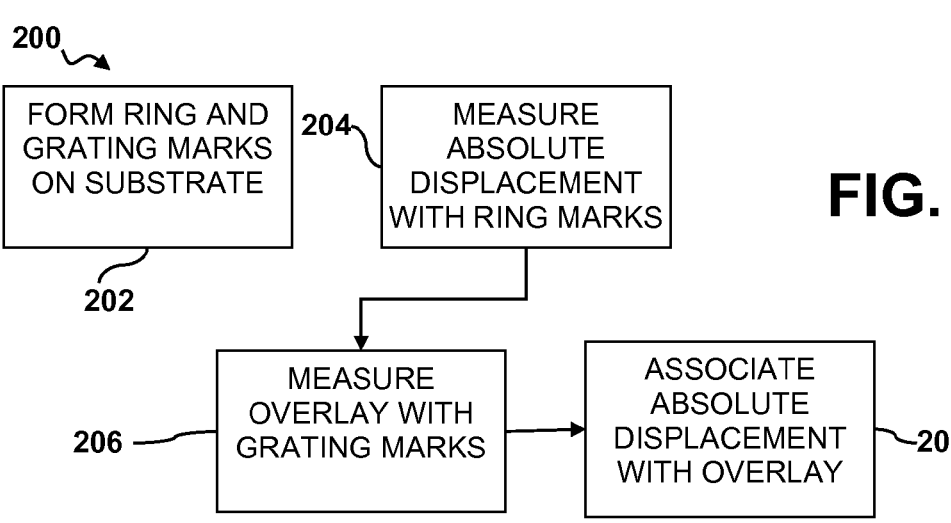
FIG. 4 is a flow diagram illustrating measurement of errors using a combined mark of the type shown in FIG. 3.

The flow diagram of FIG. 4A illustrates a method 200 for performing error measurement with a combined mark of the type shown in FIG. 3. The method 200 may be used to perform a measurement of a relative position between two substantially coplanar layers of a device wherein one layer is located on a first layer of the other. At 202 the ring-type mark 101 and grating-type mark 130 are formed on the substrate. By way of example, the first ring structure 102 and periodic structures 132B, 132C, 132E and 132H may be formed in a first layer of the device, e.g., using an optical reticle and conventional photolithography. The second ring structure 104 and periodic structures 132A, 132D, 132F, and 132G may be formed in a second layer that lies on top of the first layer, e.g., using an imprint template.

It is possible to form structures in both the first and second layers with an imprint template or to form structures in both the first and second layers with a reticle. However, there can be advantages to forming structures in the first layer with a reticle and in the second layer with an imprint template. Nano-imprint tools may not have well developed ultra-accurate stages as do the scanners (e.g., available from ASML, Nikon, Canon, etc.) which use 4× reduction optical printing using reticles. Although one may use an imprint layer as the first layer, a combination of the two tools may be advantageous for maintaining a lower cost of ownership. Critical levels requiring resolutions not easily achieved by 4× reticles with optical scanners may be printed with nano-imprint templates. When this is done, the field being printed may be aligned using combined overlay and image placement error marks of the types described herein.

At 204, absolute displacement errors may be measured using the ring-type mark 101. For example, the ring-type mark 101 may be used to determine the errors associated with a reticle or imprint template used to form a pattern on a wafer. At 206 the grating-type mark may be used to measure an overlay. Because the ring-type mark 101 and the grating-type mark 130 share a common centroid 103 it is possible to match the absolute displacement measurements with the overlay measurements on a point for point basis at 208. Vector errors on a reticle or nano-imprint template may be matched with scanners or steppers since their vectors are typically known. Vector errors may be understood as follows. An image placement measurement tool compares a grid pattern image formed on a wafer to grid coordinates of the tool. The image placement measurement tool uses vertical and horizontal edges of the ring-type mark 101 or other marks as references for determining image placement. If a grid pattern on a reticle or template were to be perfectly reproduced on a wafer, the vector map would just look like a bunch of dots. If the pattern is not perfectly reproduced, the vector map would have arrows pointing in various directions with various magnitudes. The arrows would represent the direction and magnitude of displacement of the intersections in the grid pattern formed on the wafer relative to tool-based grid coordinates for a perfect grid. This vector map would be the pattern placement or grid error. If one then tries to print on top of this grid another grid——a vector map measuring how accurately the second grid's intersections are placed over those of the first would be the layer-to layer vector map.

Embodiments of the present invention allow one to perform a dissection of the total overlay so that for a IX template or reticle the entire overlay error budget can be determined. For example, the total overlay specification on a 25-nm process may be about 8-9 nm. Tools commonly used to determine image placement error from the ring-type mark 101 can have an absolute accuracy of about 34 nm. Once these errors are measured for the pattern in each layer, that can be associated with the layer to layer overlay error as determined by the grating type mark 130 as part of the overall error budget.

Figure 4B:
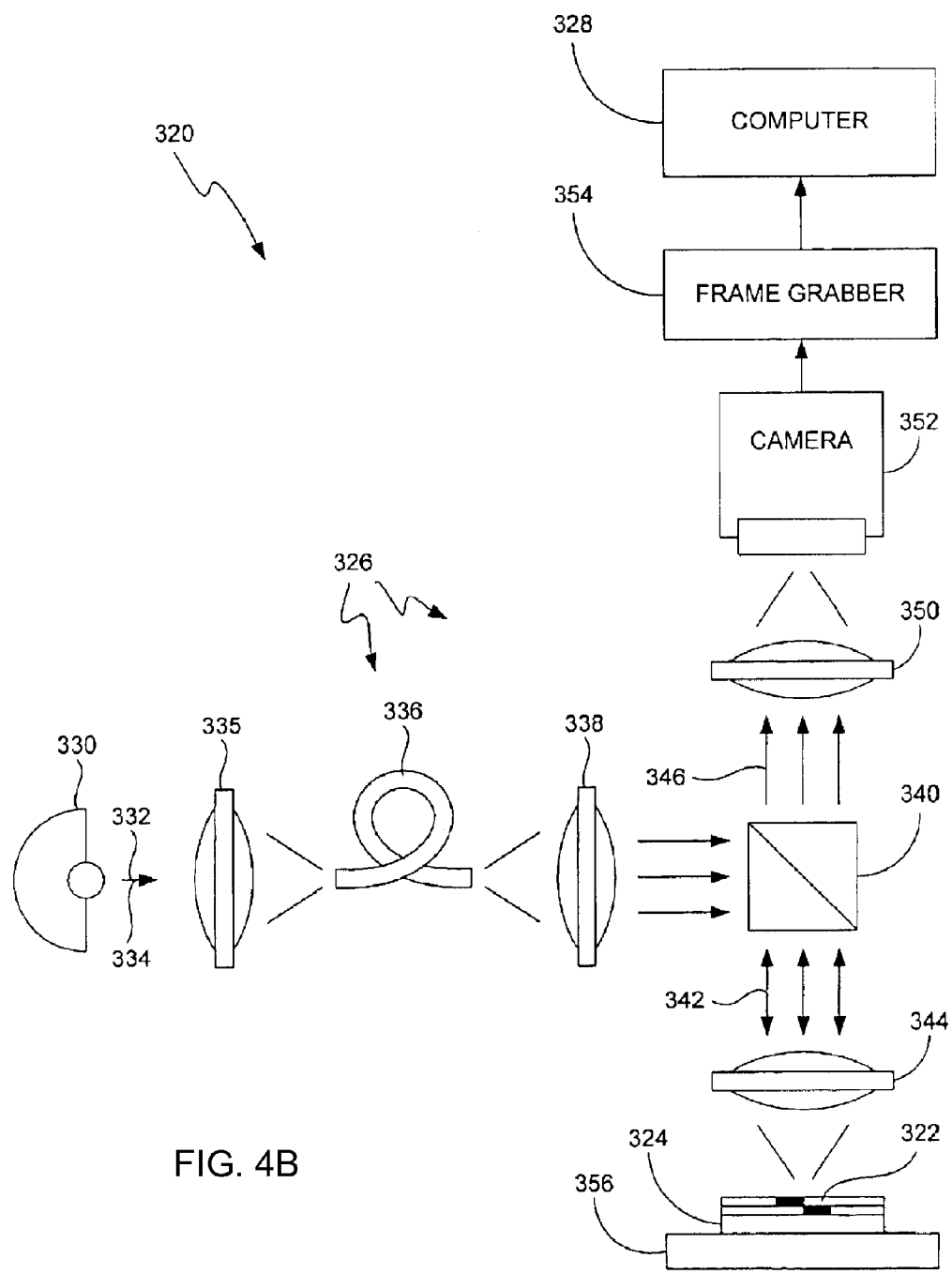

As discussed above, the absolute displacement measurements may be measured with the ring-type mark 101 using a high magnification microscope, such as a CD-SEM. There are a number of different techniques for measuring overlay with the grating-type mark 130 and/or the ring-type mark 101. By way of example, FIG. 4B is a simplified diagram of an overlay measurement system or metrology tool 320 that may be used to measure overlay using the grating-type marks in the combined mark 100 described above via imaging. Imaging is a very developed technology with large user acceptance, and components that are readily available to the user. As is generally well known, imaging is an effective way to collect a large amount of information at any one time. That is, all points within the mark may be measured simultaneously. Furthermore, imaging allows a user to see what is actually being measured on the wafer. The dimensions of various components are exaggerated to better illustrate this embodiment. The overlay measurement system 320 is arranged to determine overlay error via one or more overlay targets 322 disposed on a wafer 324. In most cases, the overlay targets 322 are positioned within the scribe lines of the wafer 324. As is generally well known, scribe lines are the areas of the wafer used for sawing and dicing the wafer into a plurality of dies. It should be noted, however, that this is not a limitation and that the position of the targets may vary according to the specific needs of each device design. As shown, the overlay measurement system 320 includes an optical assembly 326 and a computer 328. The optical assembly 326 is generally arranged to capture the images of the overlay target 322. The computer, on the other hand, is generally arranged to calculate the relative displacement of the elements of the overlay target from the captured images.

In the illustrated embodiment, the optical assembly 326 includes a light source 330 (e.g., incoherent or coherent, although incoherent is generally preferred) arranged to emit light 332 along a first path 334. The light 332 is made incident on a first lens 335, which focuses the light 332 onto a fiber optic line 336 configured to pass the light 332 therethrough. When the light 332 emerges from fiber optic line 336, it then passes through a second lens 338, which is arranged to collimate the light 332. The collimated light 332 then continues on its path until it reaches a beam splitter cube 340, which is arranged to direct the collimated light onto a path 342. The collimated light 332 continuing along path 342 is made incident on an objective lens 344, which focuses the light 332 onto the wafer 324.

The light 332, which reflects off of the wafer 324, is then collected by the objective lens 344. As should be appreciated, the reflected light 332 that is collected by the objective lens 344 generally contains an image of a portion of the wafer 324, as for example, the image of the overlay target 322. When the light 332 leaves the objective 344, it continues along path 342 (backwards) until it reaches the beam splitter cube 340. In general, the objective lens 344 manipulates the collected light in a manner that is optically reverse in relation to how the incident light was manipulated. That is, the objective lens 344 re-collimates the light 332 and directs the light 332 towards the beam splitter cube 340. The beam splitter cube 340 is arranged to direct the light 332 onto a path 346. The light 332 continuing on path 346 is then collected by a tube lens 350, which focuses the light 332 onto a camera 352 that records the image of the wafer 324, and more particularly the image of the target 322. By way of example, the camera 352 may be a charge couple device (CCD), a two-dimensional CCD, or linear CCD array. In most cases, the camera 352 transforms the recorded image into electrical signals, which can be used by, and which are sent to the computer 328. After receiving the electrical signals, the computer 328 performs analysis algorithms that calculate the overlay error of the image. Analysis algorithms will be described in greater detail below.

The system 320 further includes a frame grabber 354 that works with the computer 328 and the camera 352 to grab images from the wafer 324. Although the frame grabber 354 is shown as a separate component, it should be noted that the frame grabber 354 may be part of the computer 328 and/or part of the camera 352. The frame grabber 354 typically has two functions-target acquisition and image grab. During target acquisition, the frame grabber 354 and computer 328 cooperate with a wafer stage 356 to place the target in focus and to position the target as closes as possible to the center of the field of view (FOV) of the metrology tool. In most cases, the frame grabber grabs a plurality of images (e.g., not the images used to measure overlay) and the stage moves the wafer between these grabs until the target is correctly positioned in the X, Y and Z directions. As should be appreciated, the X&Y directions generally correspond to the field of view (FOV) while the Z direction generally corresponds to the focus. Once the frame grabber determines the correct position of the target, the second of these two functions is implemented (e.g., image grab). During image grab, the frame grabber 354 makes a final grab or grabs so as to capture and store the correctly positioned target images, i.e., the images that are used to determine overlay.

After grabbing the images, information must be extracted from the grabbed images to determine the registration error. The extracted information may be digital information or in waveforms. Various algorithms may then be used to determine the registration error between various layers of a semiconductor wafer. For example, a frequency domain based approach, a space domain based approach, Fourier transform algorithms, zero-crossing detection, correlation and cross-correlation algorithms and others may be used.

Algorithms proposed for determining overlay via the marks described herein (e.g., marks that contain periodic structures) can generally be divided into a few groups. For instance, one group may relate to phase retrieval based analysis. Phase retrieval based analysis, which is often referred to as frequency domain based approaches, typically involves creating one dimensional signals by collapsing each of the working zones by summing pixels along the lines of the periodic structure. Examples of phase retrieval algorithms that may be used are described in U.S. Pat. No. 6,023,338 issued to Bareket, U.S. Pat. No. 6,462,818 issued to Bareket, and U.S. Pat. No. 6,486,954 issued to Mieher, all of which are incorporated herein by reference.

Yet another phase retrieval algorithm that may be used is described in U.S. application Ser. No. 09/697,025 filed on Oct. 26, 2000, which is also incorporated herein by reference. The phase retrieval algorithm disclosed therein decomposes signals into a set of harmonics of the basic signal frequency. Quantitative comparison of different harmonics' amplitudes and phases provide important information concerning signals' symmetry and spectral content. In particular, the phase difference between the 1st and 2nd or higher harmonics of the same signal (calibrated with their amplitudes) measures the degree of the signal asymmetry. The major contributions to such asymmetry come from the optical misalignment and illumination asymmetry in the metrology tool (tool induced shifts), as well as process induced structural features (wafer induced shifts). Comparing this misregistration between the phases of the 1st and the 2nd harmonics for the signals acquired from different parts of the field of view on the same process layer may provide independent information about optical aberrations of the metrology tool. Finally, comparing these misregistrations from measurements at a given orientation with those obtained after rotating the wafer 180 degrees allows separation of the tool induced and wafer induced shifts due to asymmetry.

Yet another phase retrieval algorithm that may be used is Wavelet analysis. Wavelet analysis is somewhat similar to that described in the section above, however, now a dynamic window is moved across the one dimensional signal and the phase estimation is carried out in a more localized way. This is particularly of interest with use in the case of a chirped periodic structure.

Another group may relate to intensity correlation based methods. In this approach the centers of symmetry for each process layer is found separately by calculating the cross covariance of one signal with the reversed signal from the opposite part of the mark, from the same process layer. This technique is similar to techniques used today with regards to box in box targets. Such a technique may be used with the ring-type target 101 of the combined mark 100.

The above techniques are brought by way of example and have been tested and demonstrated good performance. Other alternative algorithmic methods for calculation of overlay include other variations of auto & cross correlation techniques, error correlation techniques, error minimization techniques, such as minimization of absolute difference, minimization of the square of the difference, threshold based techniques including zero cross detection, and peak detection. There are also dynamic programming algorithms which can be used for searching for the optimal matching between two one-dimensional patterns. As mentioned above, the analysis algorithms and approaches may be utilized with respect to all of the various overlay marks described in the previous section.

Importantly, it should be noted that the above diagram and description thereof is not a limitation and that the overlay image system may be embodied in many other forms. For example, it is contemplated that the overlay measurement tool may be any of a number of suitable and known imaging or metrology tools arranged for resolving the critical aspects of overlay marks formed on the surface of the wafer. By way of example, overlay measurement tool may be adapted for bright field imaging microscopy, darkfield imaging microscopy, full sky imaging microscopy, phase contrast microscopy, polarization contrast microscopy, and coherence probe microscopy. It is also contemplated that single and multiple image methods may be used in order to capture images of the target. These methods include, for example, single grab, double grab, single grab coherence probe microscopy (CPM) and double grab CPM methods. These types of systems, among others, are readily available commercially. By way of example, single and multiple image methods may be readily available from KLA-Tencor of San Jose, Calif.

Figure 5A:
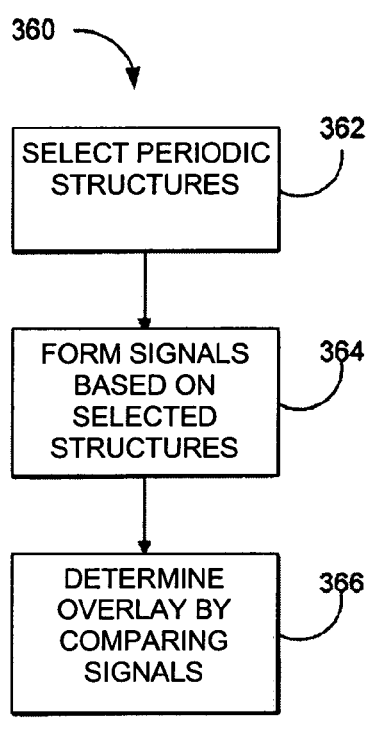
FIG. 5 is a simplified diagram of an overlay measurement system, in accordance with one embodiment of the present invention.
Figure 5B:
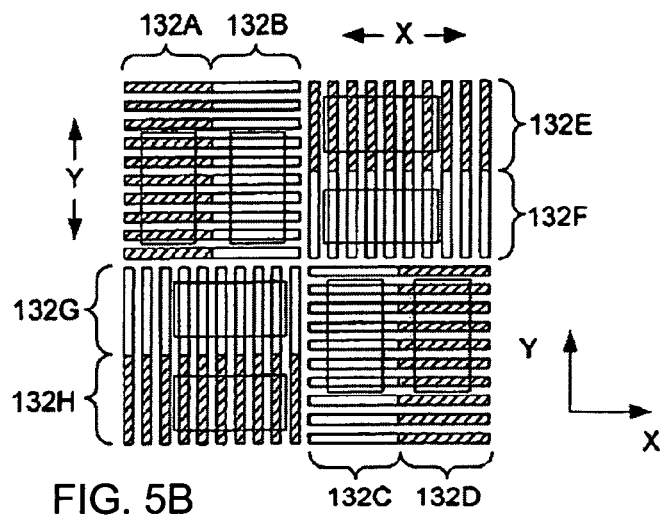
Figure 5C:
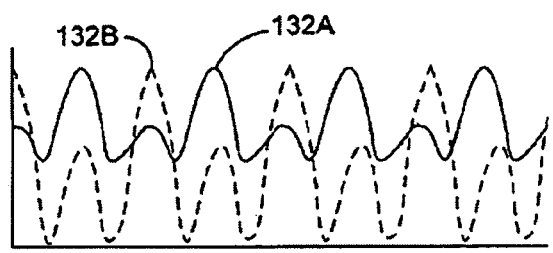

Calculation of overlay using the grating-type mark 130 is described e.g., in U.S. Pat. No. 6,921,916 issued to Adel et al. FIG. 5A is a simplified flow diagram illustrating a method 360 of calculating overlay, in accordance with one embodiment of the present invention. For ease of discussion, this method will be described via the grating type mark 130 of the combined mark 100 shown in FIG. 3. The grating type mark 130 is shown for convenience next to the flow diagram in FIG. 5B. The method 360 begins at step 362 where periodic structures are selected from the captured image. By way example, for calculating X-overlay, grating structures 132E-H may be selected, and for calculating Y-overlay, periodic structures 132A-D may be selected. After selecting the working zones, the process flow proceeds to step 364 where representative signals are formed for each of the selected working zones. This may be accomplished by collapsing the 2D images into ID signals by averaging over X for Y-overlay calculations and by averaging over Y for X-overlay calculations. By way of example, FIG. 5C illustrates a first collapsed ID signal for working zone 132A and a second collapsed ID signal for working zone 132B. It should be noted, that FIG. 5C is representative of any of the pairs of juxtaposed working zones. After forming the signals, the process flow proceeds to step 366 where the overlay is determined by comparing the signals.

The overlay may be determined from the signal, e.g., via a covariance-based overlay algorithm, which is based upon calculation of the cross-correlation between the patterns belonging to the same process layers. As a result, the centers of symmetry for both layers are found, and their misregistration is essentially the overlay. Alternatively, this may be accomplished via a Fourier Decomposition overlay algorithm, which utilizes the periodical character of the grating structures. This algorithm decomposes signals acquired from the target patterns to a series of Fourier harmonics. Comparison of phases between the same order harmonics from different process layers calibrated to nominal pitch of the grating patterns serves then as a basis for overlay calculation. Accordingly, this algorithm provides several independent overlay results-one for each Fourier order.

While this invention has been described in terms of several preferred embodiments, there are alterations, permutations, and equivalents, which fall within the scope of this invention.

For example, although the invention has been described in terms of manufacturing semiconductor devices, it should be realized that the invention may also be suitable for manufacturing other types of devices such as microfabrication of optical or optoelectronic devices, microfabrication of magnetic storage media or magnetic storage read/write or input/output devices, microfabrication using lithographic patterning in general, to include photolithography down to 100 nm exposure wavelengths, extreme-ultraviolet lithography with wavelengths 10 nm to 100 nm, X-rays lithography with wavelengths <10 nm, electron beam lithography, ion beam patterning, or mixed lithography using more than one of these methods.

In addition, besides supplying data for overlay measurements, periodic structure targets are capable of providing much additional information for target, stepper and metrology tool diagnostics (e.g., contrast, sharpness, graininess, acquisition quality and symmetry metrics). For example, comparison of overlay, precision, TIS, and TIS variability results obtained by Covariance and Fourier Decomposition methods can serve as one such instrument. Measurement of phase difference between different Fourier harmonics from the same signal gives important information concerning symmetry of the marks due to process imperfectness, aberrations or illumination problems. Performing the same analysis for the target rotated by 180° allows the separation of asymmetries on the wafer from those due to the metrology tool. Filling the whole FOV by target structures allows the selection of different working zones, thus providing information about variations within a single target and allowing additional optimization. Finally, grating targets provide an opportunity for simpler diagnostic of the target's tilt in FOV.

Furthermore, although the algorithms have been described as utilizing one dimensional arrays of information, it should be noted that they may also be applied to two dimensional arrays of information.

Moreover, although the marks herein have been described for measuring overlay, they may also be used for one or more of the following measurements or applications: CD, exposure monitoring, resist profile monitoring, focus monitoring, and the like.

Figure 7:
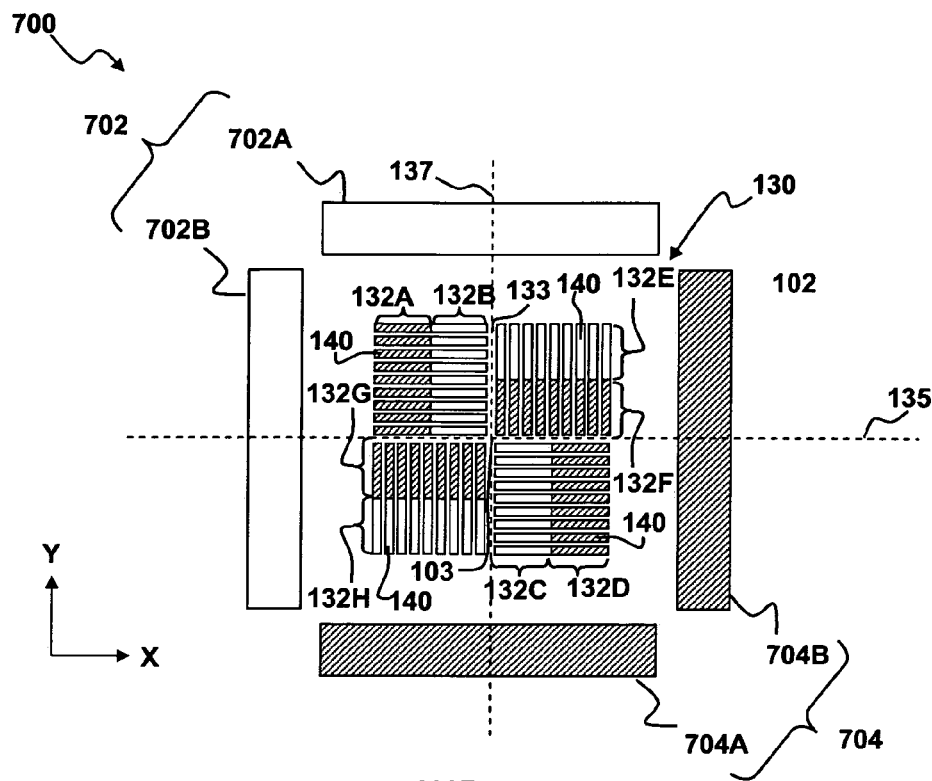
FIG. 7 is a top plan view of a combined overlay and image placement mark according to an alternative embodiment of the present invention.

Many variations are possible on the embodiments described above. For example, as shown in FIG. 7, a more compact combined target 700 may use bar-type image placement error marks 702, 704 in lieu of the ring-type marks 102, 104 shown in FIG. 3. A grating type mark 130 of the type described above with respect to FIG. 3 is located within a perimeter defined by the image placement error marks 702, 704. Preferably there is sufficient clearance between the image placement error marks 702, 704 and periodic structures 132A-132H that the periodic structures do not interfere with measurement of the image placement error marks 702,704. In the example depicted in FIG. 7, structures without cross-hatching are formed in a first layer and cross-hatched structures are formed in a second layer that overlies the first layer. A first bar-type image placement error mark 702 includes an "x" segment 702A and "y" segment 702B that are oriented substantially perpendicular to each other. Each segment 702A, 702B has two substantially parallel edges that can be used in making image placement error measurements, e.g., with a Leica tool. The second bar-type image placement error mark 704 has a similarly configured "x" segment 704A and "y" segment 704B. The bar-type marks 702, 704 are advantageous in that they may potentially take up less real-estate than the "ring-in-ring type structure shown in FIG. 3.

Figure 8A:
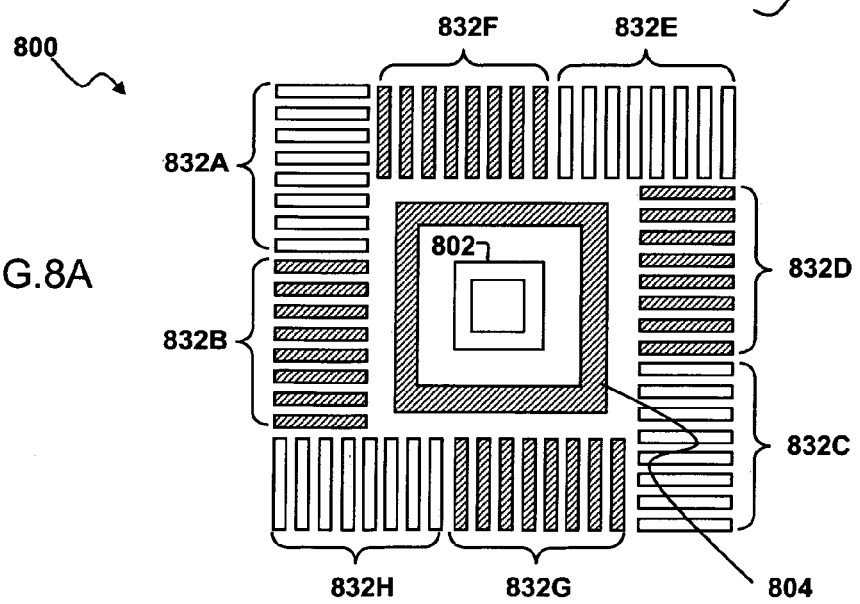
FIG. 8A is a top plan view of a combined overlay and image placement target according to an embodiment of the present invention.

In other embodiments of the invention, image placement error marks may be located within a perimeter defined by grating-type marks. For example as shown in FIG. 8A, a combined mark 800 may include first and second ring-type marks 802, 804 for image placement error measurement and grating-type marks made from eight periodic structures 832A-832H for overlay error measurement. As in previous drawings, structures formed in a first layer are shown without cross-hatching and structures formed in a second layer are cross-hatched. The first and second ring type marks 802, 804 are disposed with a perimeter defined by the periodic structures 832A-832H. Preferably there is sufficient clearance between the first ring-type mark 802 and the periodic structures 832A-832H that the periodic structures do not interfere with measurement of the image placement error mark 902. The first ring-type mark 802 has a common centroid with a grating-type mark including periodic structures 832A, 832C, 832E and 832H. The first ring-type mark has a common centroid with a grating-type mark including periodic structures 832B, 832D, 832F and 832G. The second ring structure 802 lies within the first ring structure 802. The common centroids may be located at an intersection of an "x" axis 835 and a "y" axis 837.

Figure 8B:
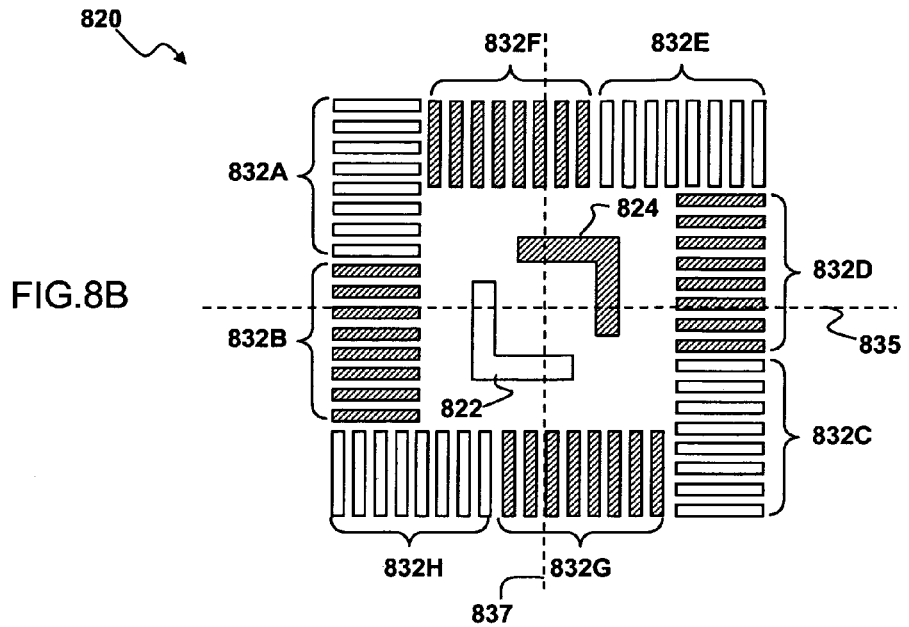
FIG. 8B is a top plan view of a combined overlay and image placement target according to an alternative embodiment of the present invention.

In alternative embodiments of the invention, other image placement error targets may be used in lieu of the ring structures 802, 804. In FIG. 8B, structures formed in a first layer are shown without cross-hatching and structures formed in a second layer are cross-hatched. For example, as shown in FIG. 8B, a combined target 820 "L"-type image placement targets 822, 824 with a perimeter defined by periodic structures 832A-832H. Target 822 has a common centroid with a grating-type mark including periodic structures 832A, 832C, 832E and 832H. Target 824 has a common centroid with a grating-type mark including periodic structures 832B, 832D, 832F and 832G. The common centroids may be located at an intersection of an "x" axis 835 and a "y" axis 837. Preferably there is sufficient clearance between the L-type marks placement error marks 822, 824 and periodic structures 832A-832H that the periodic structures do not interfere with measurement of the image placement error marks 822,824.

Figure 8C:
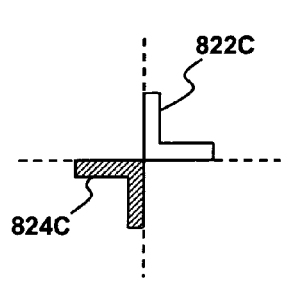
FIGS. 8C-8E are top plan views of alternative image placement marks that may be used in the combined overlay and image placement target of FIG. 8A.
Figure 8D:
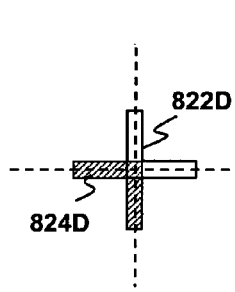
Figure 8E:
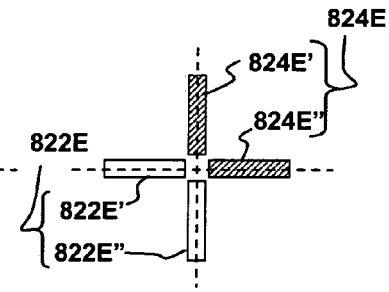

As alternatives to the orientation of the L-type marks 822, 824, the combined target 820 may alternatively use "L"-type marks 822C, 824C having corners that meet as shown in FIG. 8C or "L"-type marks 822D, 824D having corners that overlap as shown in FIG. 8D. These marks may be aligned with respect to the "x" axis 835 and "y" axis 837 to provide common centroids. In other embodiments, the L-type marks may be replaced with "bar" type marks. FIG. 8E depicts an example of bar-type image placement error marks 822E, 824E that may be used in the combined mark of FIG. 8B in lieu of L-type marks 822 824. A first bar-type mark 822E includes a horizontal segment 822E' and a vertical segment 822E". A second bar-type mark 824E includes a horizontal segment 824E' and a vertical segment 824E". The horizontal segments 822E', 824E' may be aligned with the "x" axis 835 and the vertical segments 822E", 824E" may be aligned with the "y" axis 837 to provide common centroids with corresponding grid-type marks.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A target for use in measuring the relative position between two substantially coplanar layers of a device wherein a second layer of said two layers is located on a first layer of said two layers and for measuring an image placement error of each layer, the target comprising:
    a first ring structure to be placed on said first layer of said device that is visible through said second layer;
    a first periodic structure to be placed on said first layer of said device within said first ring structure, wherein said first periodic structure is visible through said second layer;
    a second periodic structure that complements said first periodic structure with said second periodic structure placed on said second layer of said device at a location that is adjacent said first periodic structure within said first ring structure when said second layer is placed on said first layer with said first and second layers being in fixed position with respect to each other; and
    a second ring structure that complements said first ring structure with said second ring structure placed on said second layer of said device within said first ring structure and with said first and second periodic structures being located within said second ring structure.

2. The apparatus of claim 1 wherein the first and second periodic structures cover a region less than about 20 microns wide.

3. The apparatus of claim 1 wherein the first and second periodic structures include features having a characteristic dimension of about 30 nanometers or less.

4. The apparatus of claim 1, wherein the first ring structure includes at least one straight edge that is aligned with a corresponding straight edge of the second ring structure.

5. The apparatus of claim 1 wherein the first and second ring structures form a box-in-box structure.

6. The apparatus of claim 1 wherein said second ring structure has a width of about 35 microns or less.

7. The apparatus of claim 1, further comprising a third periodic structure to be placed on said first layer of said device within said first ring structure, wherein said third periodic structure is visible through said second layer;
    a fourth periodic structure that complements said third periodic structure with said fourth periodic structure placed on said second layer of said device at a location that is adjacent said third periodic structure within said first ring structure when said second layer is placed on said first layer with said first and second layers being in fixed position with respect to each other.

8. The apparatus of claim 7 wherein said third periodic structure is the same as the first periodic structure rotated by 90° and said fourth periodic structure is the same as the second periodic structure rotated by 90°.

9. The apparatus of claim 1 wherein the first and second ring structures and the first and second periodic structures share a common centroid.

10. The apparatus of claim 1 wherein the first or second ring structures and the first or second periodic structures are formed on a semiconductor wafer, reticle or imprint template.

11. A method for performing a measurement of a relative position between two substantially coplanar layers of a device wherein a second layer of said two layers is located on a first layer of said two layers, comprising:
    forming a first ring structure to be placed on said first layer of said device that is visible through said second layer;
    forming a first periodic structure to be placed on said first layer of said device within said first ring structure, wherein said first periodic structure is visible through said second layer;
    forming a second periodic structure that complements said first periodic structure with said second periodic structure placed on said second layer of said device at a location that is adjacent said first periodic structure within said first ring structure when said second layer is placed on said first layer with said first and second layers being in fixed position with respect to each other; and
    forming a second ring structure that complements said first ring structure with said second ring structure placed on said second layer of said device within said first ring structure and with said first and second periodic structures being located within said second ring structure.

12. The method of claim 11, further comprising measuring an absolute displacement with said first and/or second ring structures.

13. The method of claim 11, further comprising measuring an overlay error with said one or more of said first and second periodic structures.

14. The method of claim 11, further comprising:
forming a third periodic structure to be placed on said first layer of said device within said first ring structure, wherein said third periodic structure is visible through said second layer; and
a fourth periodic structure that complements said third periodic structure with said fourth periodic structure placed on said second layer of said device at a location that is adjacent said third periodic structure within said first ring structure when said second layer is placed on said first layer with said first and second layers being in fixed position with respect to each other.

15. The method of claim 14, wherein said third and fourth periodic structures are oriented substantially perpendicular to said first and second periodic structures.

16. The method of claim 14, further comprising measuring an overlay error along a first direction with said first and second periodic structures and measuring an measuring an overlay error in a second direction with said third and fourth periodic structures.

17. The method of claim 16 wherein said first and second directions are substantially perpendicular to one another.

18. The method of claim 11 wherein said first ring structure and said first periodic structure are formed using an optical reticle.

19. The method of claim 18 wherein said second ring structure and said second periodic structure are formed with an imprint template.

20. The method of claim 11 wherein said first and second ring structures and said first and second periodic structures have a common centroid.

21. A combined overlay and image placement error target, comprising:
an image placement error mark having a first straight segment of finite thickness and a second segment of finite thickness, wherein the first and second straight segments are substantially perpendicular with respect to each other; and
a grating-type mark having one or more periodic structures, wherein the grating-type mark is located entirely within a perimeter of the image placement error mark that includes the first and second straight segments, and wherein the image placement error mark and the grating-type mark have a common centroid.

22. The target of claim 21 wherein the image placement error mark and grating-type mark are formed in the same layer of a device.

23. The target of claim 22 wherein the grating-type mark is configured to align with a complementary grating-type mark in a different layer of the device.

24. The target of claim 23 wherein the grating-type mark and complementary grating-type mark have a common centroid when grating-type mark is aligned with the complementary grating-type mark.

25. The target of claim 24 wherein the image placement error mark is configured to align with a complementary ring-type mark in the different layer of the device, wherein the grating-type mark and complementary grating type mark are located entirely within a perimeter of the complementary image placement error mark when the image placement error mark is aligned with the complementary image placement error.

26. The target of claim 25 wherein the grating-type mark, complementary grating-type mark, image placement error mark and complementary image placement error mark have a common centroid when grating-type mark is aligned with the complementary grating-type mark and/or when the image placement error mark is aligned with the complementary image placement error mark.

27. The target of claim 21, wherein the image placement error mark is a ring-type mark.

28. The target of claim 21, wherein the image placement error mark is a bar-type mark.

29. The target of claim 21, wherein the image placement error mark is an L-type mark.

30. A combined overlay and image placement error target, comprising:
a first image placement error structure to be placed on a first layer of a device such that the first image placement error structure is visible through said second layer;
a first periodic structure to be placed on said first layer of said device proximate said first image placement error structure, wherein said first periodic structure is visible through said second layer, wherein said first image placement error structure and said first periodic structure have a common centroid, and wherein said first periodic structure is sufficiently spaced-apart from said first image placement error structure that said first periodic structure does not interfere with an image placement error measurement made using said first image placement error structure;
a second periodic structure that complements said first periodic structure with said second periodic structure placed on said second layer of said device at a location that is adjacent said first periodic structure when said second layer is placed on said first layer; and
a second image placement error structure placed on said second layer of said device proximate said first and second periodic structures, wherein said second image placement error structure and said second periodic structure have a common centroid wherein said first and second periodic structures are sufficiently spaced-apart from said second image placement error structure that said first and second periodic structures do not interfere with an image placement error measurement made using said second image placement error structure.

31. The target of claim 30 wherein said first and second image placement error targets each include first and second straight segments, wherein said first straight segment is substantially perpendicular to said second straight segment, and wherein each of said first and second straight segments includes substantially parallel spaced apart edges.

32. The target of claim 31 wherein said first and second image placement error targets are bar type targets.

33. The target of claim 31 wherein said first and second image placement error targets are L-type targets.

34. The target of claim 31 wherein said first and second image placement error targets are first and second ring-type targets.

35. The target of claim 34 wherein said second ring-type target lies within said first ring-type target.

36. The target of claim 35 wherein said first and second periodic structures lie within said second ring-type target.

37. The target of claim 31 wherein said first and second image placement error targets lie within a perimeter defined by said first and second periodic structures.

* * * * *